(12) United States Patent
Shirahama

(10) Patent No.: US 9,281,457 B2
(45) Date of Patent: Mar. 8, 2016

(54) SEMICONDUCTOR DEVICE AND METHOD OF MANUFACTURING THE SEMICONDUCTOR DEVICE

(71) Applicant: Nichia Corporation, Anan-shi, Tokushima (JP)

(72) Inventor: Satoshi Shirahama, Yokohama (JP)

(73) Assignee: Nichia Corporation, Anan-shi (JP)

( * ) Notice: Subject to any disclaimer, the term of this patent is extended or adjusted under 35 U.S.C. 154(b) by 359 days.

(21) Appl. No.: 13/910,245

(22) Filed: Jun. 5, 2013

(65) Prior Publication Data

US 2013/0267050 A1  Oct. 10, 2013

Related U.S. Application Data

(63) Continuation of application No. 12/770,069, filed on Apr. 29, 2010, now Pat. No. 8,476,726.

(30) Foreign Application Priority Data

Apr. 30, 2009  (JP) ................... 2009-110785
Apr. 1, 2010  (JP) ................... 2010-085124

(51) Int. Cl.
*H01L 21/44*  (2006.01)
*H01L 21/00*  (2006.01)
(Continued)

(52) U.S. Cl.
CPC ............... *H01L 33/52* (2013.01); *H01L 24/48* (2013.01); *H01L 24/49* (2013.01); *H01L 24/85* (2013.01); *H01L 23/4952* (2013.01); *H01L 24/45* (2013.01); *H01L 33/62* (2013.01); *H01L 2224/45015* (2013.01); *H01L 2224/45124* (2013.01); *H01L 2224/45144* (2013.01); *H01L 2224/45147* (2013.01); *H01L 2224/45169* (2013.01); *H01L 2224/4809* (2013.01); *H01L 2224/4813* (2013.01); *H01L 2224/48095* (2013.01); *H01L 2224/48247* (2013.01); *H01L 2224/48465* (2013.01); *H01L 2224/48475* (2013.01); *H01L 2224/48599* (2013.01);
(Continued)

(58) Field of Classification Search
CPC .......... H01L 23/48; H01L 23/85; H01L 24/48
USPC ............... 438/617, 48; 257/E21.509
See application file for complete search history.

(56) References Cited

U.S. PATENT DOCUMENTS 4,824,005 A  4/1989 Smith, Jr.
4,984,065 A  1/1991 Sako
(Continued)

FOREIGN PATENT DOCUMENTS

JP  1-199443 A  8/1989
JP  9-51011 A  2/1997
(Continued)

*Primary Examiner* — Nitin Parekh
(74) *Attorney, Agent, or Firm* — Birch, Stewart, Kolasch & Birch, LLP

(57) ABSTRACT

Provided is a semiconductor device and a method of manufacturing the semiconductor device, in which the semiconductor device has a semiconductor element having a plurality of wires bonded to the semiconductor element with sufficient bonding reliability and has a good heat dissipation property. A semiconductor device in which a first wire is ball bonded on an electrode, and a second wire is further bonded on the ball-bonded first wire, and the first wire or an end of the second wire defines a space between itself and the ball portion of the first wire.

22 Claims, 5 Drawing Sheets

(51) Int. Cl.
  *H01L 33/52* (2010.01)
  *H01L 23/495* (2006.01)
  *H01L 23/00* (2006.01)
  *H01L 33/62* (2010.01)

(52) U.S. Cl.
  CPC .............. *H01L 2224/48699* (2013.01); *H01L 2224/4911* (2013.01); *H01L 2224/49429* (2013.01); *H01L 2224/85051* (2013.01); *H01L 2224/85181* (2013.01); *H01L 2224/85203* (2013.01); *H01L 2224/85205* (2013.01); *H01L 2924/00014* (2013.01); *H01L 2924/01004* (2013.01); *H01L 2924/0105* (2013.01); *H01L 2924/01006* (2013.01); *H01L 2924/01013* (2013.01); *H01L 2924/01015* (2013.01); *H01L 2924/01019* (2013.01); *H01L 2924/01022* (2013.01); *H01L 2924/01028* (2013.01); *H01L 2924/01029* (2013.01); *H01L 2924/01033* (2013.01); *H01L 2924/01045* (2013.01); *H01L 2924/01046* (2013.01); *H01L 2924/01047* (2013.01); *H01L 2924/01049* (2013.01); *H01L 2924/01074* (2013.01); *H01L 2924/01078* (2013.01); *H01L 2924/01079* (2013.01); *H01L 2924/01082* (2013.01); *H01L 2924/09701* (2013.01); *H01L 2924/14* (2013.01); *H01L 2924/20751* (2013.01); *H01L 2924/20753* (2013.01); *H01L 2924/20754* (2013.01)

(56) References Cited

U.S. PATENT DOCUMENTS

| | | | |
|---|---|---|---|
| 5,111,989 A | 5/1992 | Holdgrafer et al. | |
| 5,186,381 A | 2/1993 | Kim | |
| 5,198,964 A | 3/1993 | Ito et al. | |
| 5,359,227 A | 10/1994 | Liang et al. | |
| 5,842,628 A | 12/1998 | Nomoto et al. | |
| 5,866,953 A | 2/1999 | Akram et al. | |
| 5,960,262 A | 9/1999 | Torres et al. | |
| 6,153,940 A | 11/2000 | Zakel et al. | |
| 6,184,587 B1 | 2/2001 | Khandros et al. | |
| 6,215,182 B1 | 4/2001 | Ozawa et al. | |
| 6,242,803 B1 | 6/2001 | Khandros et al. | |
| 6,252,298 B1 | 6/2001 | Lee et al. | |
| 6,495,773 B1 | 12/2002 | Nomoto et al. | |
| 6,602,778 B2 * | 8/2003 | Manning et al. | 438/617 |
| 6,778,406 B2 | 8/2004 | Eldridge et al. | |
| 6,784,539 B2 | 8/2004 | Efland | |
| 6,787,926 B2 | 9/2004 | Chen et al. | |
| 6,815,836 B2 | 11/2004 | Ano | |
| 6,847,105 B2 | 1/2005 | Koopmans | |
| 6,854,637 B2 | 2/2005 | Harun et al. | |
| 6,882,056 B2 | 4/2005 | Komiyama et al. | |
| 6,933,608 B2 * | 8/2005 | Fujisawa | B23K 20/004 228/102 |
| 6,982,220 B1 | 1/2006 | Liou | |
| 7,019,335 B2 | 3/2006 | Suenaga | |
| 7,078,808 B2 | 7/2006 | Gerber | |
| 7,176,570 B2 | 2/2007 | Takahashi | |
| 7,188,759 B2 | 3/2007 | Calpito et al. | |
| 7,192,861 B2 | 3/2007 | Ano | |
| 7,285,854 B2 | 10/2007 | Ishikawa et al. | |
| 7,314,818 B2 | 1/2008 | Takahashi et al. | |
| 7,347,352 B2 | 3/2008 | Qin et al. | |
| 7,443,042 B2 | 10/2008 | Bambridge et al. | |
| 7,464,854 B2 | 12/2008 | Babinetz | |
| 7,584,881 B2 | 9/2009 | Qin et al. | |
| 7,651,022 B2 | 1/2010 | Babinetz et al. | |
| 7,808,116 B2 | 10/2010 | Mii et al. | |
| 7,821,140 B2 | 10/2010 | Mii et al. | |
| 8,132,709 B2 | 3/2012 | Hayashi et al. | |
| 2002/0089070 A1 * | 7/2002 | Manning | H01L 23/52 257/784 |
| 2002/0137327 A1 | 9/2002 | Arakawa | |
| 2002/0158325 A1 | 10/2002 | Yano et al. | |
| 2003/0155660 A1 * | 8/2003 | Takahashi et al. | 257/777 |
| 2003/0166333 A1 | 9/2003 | Takahashi | |
| 2003/0230796 A1 | 12/2003 | Ismail et al. | |
| 2004/0104477 A1 * | 6/2004 | Fujisawa | 257/738 |
| 2004/0191954 A1 * | 9/2004 | Ano | 438/106 |
| 2005/0072833 A1 | 4/2005 | Wong et al. | |
| 2005/0148175 A1 | 7/2005 | Yano et al. | |
| 2005/0167828 A1 | 8/2005 | Yeo et al. | |
| 2006/0189117 A1 * | 8/2006 | Takahashi et al. | 438/612 |
| 2008/0023831 A1 | 1/2008 | Nishimura et al. | |
| 2008/0111252 A1 | 5/2008 | Qin et al. | |
| 2008/0116591 A1 * | 5/2008 | Hayashi et al. | 257/784 |
| 2010/0230809 A1 | 9/2010 | Calpito et al. | |
| 2010/0237480 A1 | 9/2010 | Mii et al. | |

FOREIGN PATENT DOCUMENTS

| | | |
|---|---|---|
| JP | 10-335368 A | 12/1998 |
| JP | 2002-353267 A | 12/2002 |
| JP | 2004-172477 | 6/2004 |
| JP | 2008-130863 A | 6/2008 |
| JP | 2009-76783 A | 4/2009 |
| WO | WO 2005/114731 A2 | 12/2005 |

* cited by examiner

SEMICONDUCTOR DEVICE AND METHOD OF MANUFACTURING THE SEMICONDUCTOR DEVICE

This application is a Continuation of co-pending application Ser. No. 12/770,069, filed on Apr. 29, 2010, the entire contents of which are hereby incorporated by reference and for which priority is claimed under 35 U.S.C. §120.

BACKGROUND OF THE INVENTION

1. Field of the Invention

The present invention relates to a semiconductor device and a method of manufacturing the semiconductor device, and more particularly relates to a semiconductor device having a semiconductor element in which wire bonding is applied in or between semiconductor elements, and to a method of manufacturing the semiconductor device.

2. Description of the Related Art

Conventionally, there have been semiconductor devices using a semiconductor element in which a plurality of semiconductor elements (chips) are mounted in a package, and methods of connecting such a plurality of chips by way of wire bonding (for example in Patent Document 1) have been proposed. In the method disclosed in Patent Document 1, when a plurality of chips are wire connected, firstly, a first wire is wedge bonded at a terminal of an electrode pattern onto an upper electrode of a chip. Next, a second wire is ball bonded on the wedge-bonded portion.

With this, the ball formed by the ball bonding is connected onto the upper electrode of the chip, so that the wire is prevented from becoming a thin film at this portion and thus the wire bonding strength is enhanced.

However, the method disclosed in Patent Document 1 presents a problem that when wedge bonding is performed directly on the electrode of a semiconductor element, stable bonding cannot be obtained due to the thinned thickness of the electrode. Further, in a case where a semiconductor element is of a type having positive and negative electrodes on one side, the height of the surface of one of the electrodes is lower than the height of the surface of the light emitting element. This leads to a problem that, when the wedge bonding is performed onto the one of the surface of the electrode, the surface of the step difference of the semiconductor element may be damaged by the tip portion of the capillary. Also, in the method described in Patent Document 1, ball bonding is performed on the wedge-bonded portion. Accordingly, the distance between the wedge bonding portion of the wire and the surface of the semiconductor element becomes small and there arises a problem in which heat dissipation efficiency of adjacent members etc., disposed between the wedge-bonded portion and the semiconductor element decreases.

As a solution to solve the problems, there is proposed that a top portion of the upper surface of the ball portion of the wire loop is pressed together with a part of the wire, and a wire loop is provided to bridge between the upper surface of the ball portion and the bonding surface (for example, in Patent Document 2). With this method, problems caused by such as degradation of wires, mutual contact of wires and/or short-circuiting of a wire can be prevented.

Patent Document 1: JP 2002-353267A
Patent Document 2: JP 2008-130863A

SUMMARY OF THE INVENTION

In recent years, further higher levels of output power are in demand, and in order to comply with it, the output power of semiconductor elements (light emitting elements) has been increased. Accordingly an object of the present invention is to provide a semiconductor light emitting device of improved performance and reliability, particularly to provide a semiconductor device and a method of manufacturing the semiconductor device, where the semiconductor device has a semiconductor element having a plurality of wires bonded to the semiconductor element, and in which sufficient bonding reliability is achieved and also good heat dissipation is obtained.

The present invention relates to a semiconductor device which includes an electrode provided on a semiconductor layer, a first wire ball-bonded onto the electrode, in which, the first wire has a ball portion bonded onto the electrode, a folded portion extended from the ball portion and folded back onto itself, and a flat portion bonded onto the ball portion, and a second wire bonded onto the flat portion. The folded portion of the first wire and the ball portion, or the second wire and the ball portion define a space at a location over a peripheral portion on the ball portion of the first wire. With such an arrangement, sufficient bonding reliability of the wires can be obtained and a semiconductor device of good heat dissipation can be provided.

Also, the second wire preferably defines a space between itself and the first wire. With such an arrangement, a semiconductor device having good heat dissipation can be obtained while maintaining bonding reliability of the wires.

The present invention relates to a semiconductor device which includes an electrode provided on a semiconductor layer, a first wire ball-bonded onto the electrode, in which, the first wire has a ball portion bonded onto the electrode, a folded portion extended from the ball portion and folded back onto itself, and a flat portion bonded onto the ball portion, and a second wire bonded onto the flat portion. The second wire defines a space between itself and the folded portion of the first wire at a peripheral portion on the ball portion of the first wire. With such an arrangement, sufficient bonding reliability of the wires can be obtained and a semiconductor device of good heat dissipation can be provided.

Also, the first wire or the second wire is preferably provided approximately horizontally over the ball portion of the first wire. With such an arrangement, a semiconductor device having good heat dissipation can be obtained while maintaining bonding reliability of the wires.

Also, at the contacting surface between the wire extending form the ball portion of the first wire and the ball portion of the first wire, the difference in height between the highest and lowest points is preferably a half or less of the diameter of the wire. With such an arrangement, a semiconductor device having good heat dissipation can be obtained while maintaining bonding reliability of the wires.

The present invention also relates to a method of manufacturing a semiconductor device which includes a first step of ball bonding a first wire onto an electrode provided on a semiconductor layer, and a second step of bonding a second wire onto a ball portion of the first wire, in which in the second step, the second wire is bonded to cover the center of ball portion of the first wire. With such an arrangement, a method of manufacturing a semiconductor device having good heat dissipation while achieving sufficient bonding reliability of the wires can be provided.

According to the present invention, a semiconductor device and a method of manufacturing the semiconductor device can be provided, in which the semiconductor device has a semiconductor element having a plurality of wires bonded to the semiconductor element with sufficient bonding reliability and has a good heat dissipation property.

DETAILED DESCRIPTION OF THE PREFERRED EMBODIMENTS

Preferred embodiments (hereinafter referred to as embodiments) of the present invention will be described in detail below with reference to accompanying drawings. However, the present invention is not limited to the embodiments disclosed below.

[First Embodiment]

Figure 1:
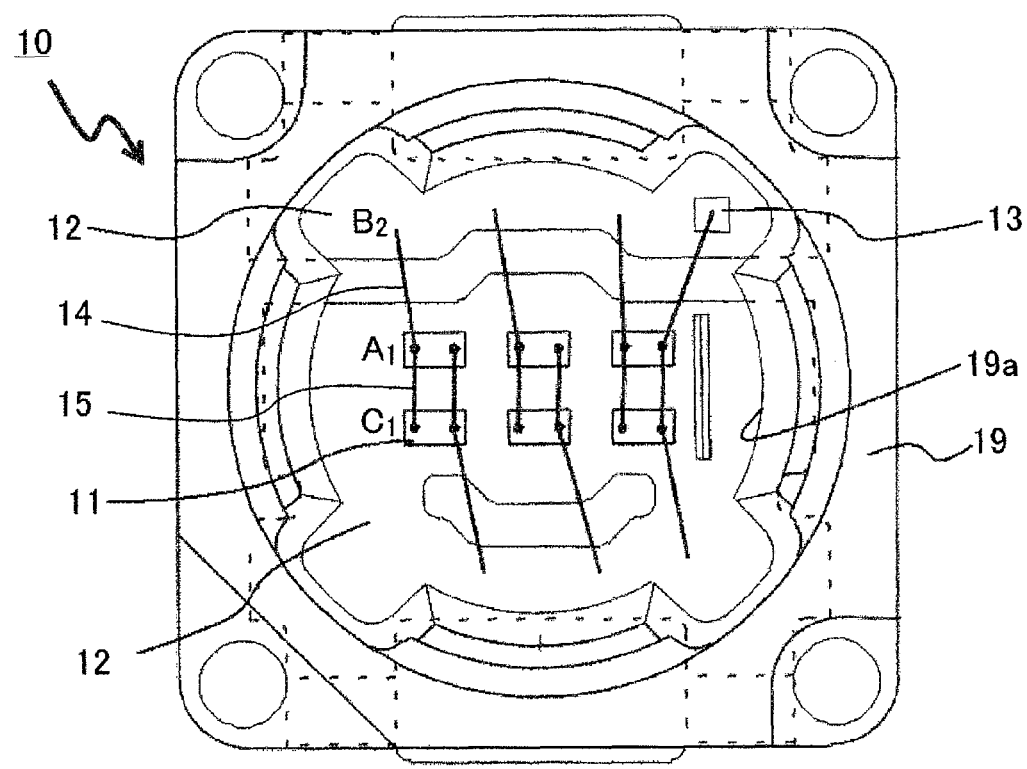
FIG. 1 is a schematic plan view showing a semiconductor device according to a first embodiment of the present invention.
Figure 2:
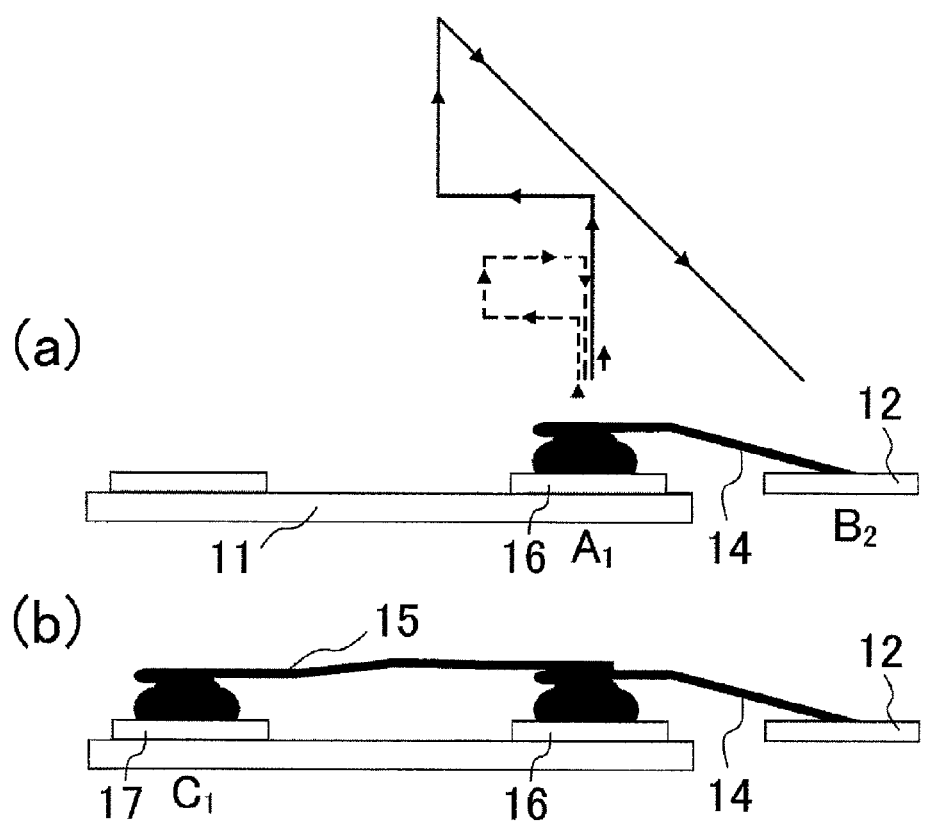
FIG. 2. is a schematic cross-sectional view illustrating a step of wire bonding of a semiconductor device according to a first embodiment of the present invention.
Figure 3A:
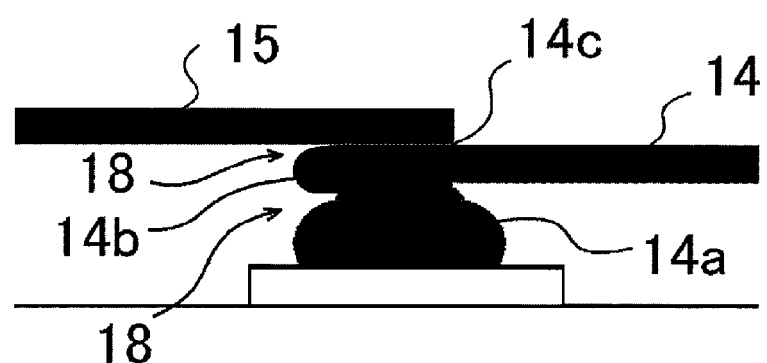
FIG. 3A is a schematic cross-sectional view illustrating wire bonding of a semiconductor device according to a first embodiment of the present invention.
Figure 3B:
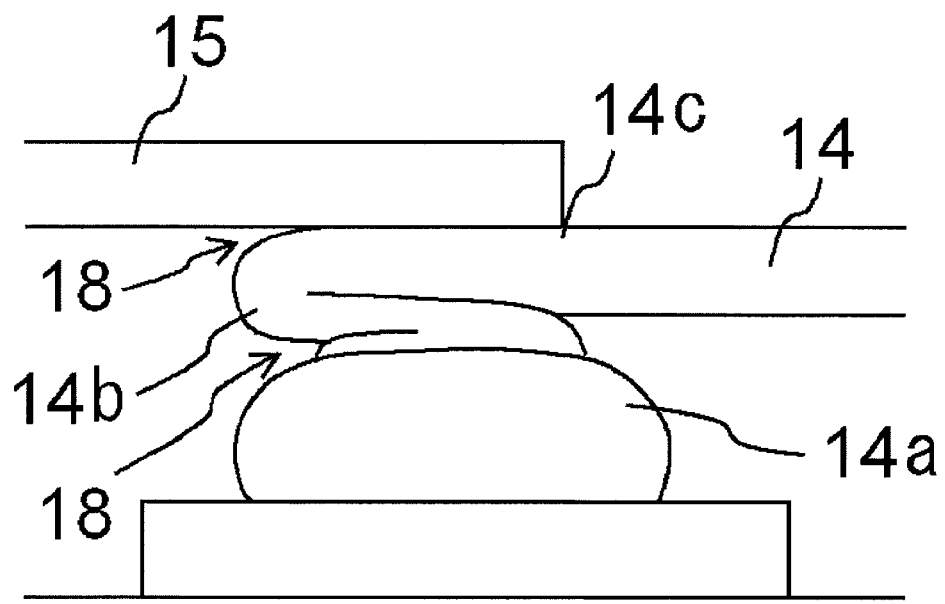
FIG. 3B is an enlarged view of FIG. 3A.

FIG. 1 is a schematic plan view showing a semiconductor device according to a first embodiment of the present invention. FIG. 2 is a schematic cross-sectional view illustrating a step of wire bonding of a semiconductor device according to a first embodiment of the present invention. FIG. 3A and FIG. 3B are schematic cross-sectional views illustrating wire bonding of a semiconductor device according to a first embodiment of the present invention.

(Semiconductor Device)

A semiconductor device according to the present embodiment is constituted by at least a semiconductor element 11 and a wire. Moreover, the semiconductor device includes a metal member to which the semiconductor element is mounted and to which a wire is connected, and further includes a sealing resin for holding them integrally. Generally, a wire connects semiconductor elements 11 with each other or a metal member 12 with a semiconductor element 11. A wire includes at least a first wire 14 and a second wire 15. In a semiconductor element 11, a first wire 14 is ball-bonded on an electrode 16 and a second wire 15 is further bonded onto the ball-bonded first wire. The first wire includes a ball portion on an electrode of the semiconductor element, a folded portion extended from approximately the canter of the upper portion of the ball portion 14a and folded back onto itself, and a flat portion 14c further extended from the folded portion 14c and bonded on the ball portion (and a part of the wire from the ball portion to the folded portion). That is, as shown in FIG. 4B, the flat portion 14c is formed in the upper wire 14 in such a manner that, when a part of the first wire 14 (the upper-side first wire 14) which is folded back from the folded portion 14b is bonded on a part of the first wire (the lower-side first wire 14) from the ball portion 14a to the folded portion 14b, the upper-side first wire 14 is subjected to a pressure in the direction toward the ball portion 14a to form the flat portion 14c. It is preferable that, not only the upper surface but also a lower surface of the upper-side wire 14 has a flat surface. In FIG. 4B, the upper-side first wire 14 is spaced apart from the ball portion 14a, but the upper-side first wire 14 may be in contact with the ball portion 14a according to the bonding conditions between the upper-side first wire 14 and the lower-side first wire 14. The second wire 15 is bonded on the flat portion 14c of the first wire 14 over the center of the ball portion 14a of the first wire 14. The second wire 15 is bonded onto the flat portion of the first wire 14 over the center of the ball portion 14a of the first wire 14. In the present embodiment, the folded portion 14b of the first wire 14 and the ball portion of the first wire 14, or the second wire 15 and the ball portion of the first wire 14 define a space 18 at a location over a peripheral portion on the ball portion 14a. With this arrangement, sufficient bonding strength can be maintained and heat generated from the semiconductor element 11 and from a portion near the semiconductor element 11 can be dissipated efficiently. Also, the first wire 14 or the second wire 15 is provided approximately horizontally over the ball portion 14a of the first wire 14. With this arrangement, stress imposed on the wire can be reduced, so that disconnection or the like of the wire can be prevented. In the semiconductor device of the present embodiment, a semiconductor element, a metal member and the like are molded or enclosed with a resin, preferably integrally. Such a resin may be made of any material as long as the material is capable of ensuring the insulation of the semiconductor element. Size and shape of the molded or sealed resin is not specifically limited.

Hereinafter, each constructional member will be described in detail below.

(Semiconductor Element)

The semiconductor elements used in the present invention are not specifically limited as long as they are made of a semiconductor. The semiconductor elements used in the present invention may be of a type in which positive and negative electrodes are formed on opposite sides or the positive and negative electrodes are formed on the same surface side. The pair of electrodes in the latter case may be disposed at the same height (approximately the same distance from the semiconductor layer), or at different heights. In a case where there is a difference in height between the pair of the electrodes, wedge bonding performed directly on the electrodes may result in a poor bonding state and may also result in damage on the dice when the capillary comes in contact with the dice, thus the effects of the present invention can be exerted more significantly. In this case, the number of the positive and negative electrodes formed is not limited to one and two or more of each may be formed. That is, a total of three or more electrodes may be formed on the same side. Particularly, when the semiconductor device of the present invention is provided with a single semiconductor element, two or more of each of the positive and negative electrodes may be formed on the same side of the semiconductor layer. This allows the above-mentioned effect of the present invention can be further exerted.

The material, thickness, and the structure of the electrodes are not specifically limited, but for example, in terms of reliability, they are preferably made of gold. However, according to the type of the wire which will be described later, either a single-layer structure or a stacked-layer structure includes gold, copper, lead, aluminum, or an alloy thereof can be employed. Further, an electrode including ITO (indium tin oxide) is also preferable. Also, a single-layer film or a stacked-layer film of a metal or an alloy which includes Ni, Ti, Au, Pt, Pd, W, Rh, or another such metal may be formed as a pad electrode on a surface of each electrode. The thickness of the pad electrode is not specifically limited, but it is preferable that Au is disposed as the final layer (the outermost side) with the thickness of about 100 nm or more. Moreover, a pad electrode made by stacking two or more different layers each containing one selected from Ti, Rh, W. and Au is also preferable.

In the semiconductor devices, either a single or a plurality of semiconductor elements may be mounted on a single semiconductor device. In a case where a plurality of semiconductor elements are mounted, the type of connection is not limited and they may be connected in parallel, in series, in a combination thereof.

(Metal Member)

A metal member serves as a substrate for mounting a semiconductor element and an electrode to be electrically connected with a semiconductor element, and may have any shape, as long as it is substantially planar, so that it may have a corrugated plate shape or a plate shape with irregular surface contour. The thickness of the metal member may be uniform, or may be thick or thin in part. Material is not specifically limited, but it is preferably formed with a material having a relatively large thermal conductivity (for example, 200 W/(m·K) or larger), a material having a relatively high mechanical strength, or a material capable of facilitating operations in punching-pressing or etching. Forming with such a material allows the heat generated by the semiconductor element can be dissipated efficiently. Examples thereof include a metal such as copper, aluminum, gold, silver, tungsten, iron, and nickel and an alloy such as iron-nickel alloy and phosphor bronze. Also, reflective plating is preferably applied to the surface of the metal member so that light from the semiconductor element can be extracted efficiently. The metal member may be a plated metal layer formed on a ceramic, glass-epoxy resin, or the like, as well as a planar metal.

Generally, two or more metal members are provided to a single semiconductor device. Two such metal members can function as a pair of positive and negative electrodes when they are placed electrically spaced apart from each other. One metal member more than the number of the semiconductor elements may be provided. The metal member may have, in addition to a region to which a semiconductor element is mounted and connected, an extended region as a lead terminal for connecting with an external component. The lead terminal can be bent or the shape of the lead terminal can be altered according to the mounting type (for example, side emitting type, top emitting type, or the like) and to the application type of the semiconductor device of the present invention.

(Wire)

A wire is a conductive member that is used to electrically connect (i.e., bond) between a metal member and an electrode formed on the surface of a semiconductor element, between the semiconductor elements, between the electrodes in a semiconductor element, or the like. Particularly, in a case where the semiconductor elements are to be connected each other, it is preferable that the semiconductor elements are connected to each other at their respective electrodes of the same polarity.

In the present invention, in a wire running between two points, a point bonded as a starting point is referred to as a first bonding point, and a point bonded as an ending point is referred to as a second bonding point. At the first bonding point, a ball or chunk formed by melting the wire is bonded onto the electrode of the semiconductor element. The connection portion of the wire which is ball-bonded as described above is referred to as a ball portion. At the second bonding point, the wire is connected without through a ball. The portion in the second bonding point where the wire is connected is referred to as a wedge bonded portion. The second bonding point (or wedge bonded portion) is preferably provided on the metal member so as to be in contact with the metal member. In a case where the second bonding portion is provided over an electrode of a semiconductor element, it is preferably provided at least through the ball portion.

Herein, the term "A bonding point" refers generally to a region in a surface of an electrode of a semiconductor element or a surface of a metal member constituting a semiconductor device, but in a case where a plurality of wires are provided, it also refers to a region which is bonded, for example, a region over the wire or the ball portion.

A wire includes at least a first wire portion and a second wire portion. The "first wire" indicates a wire which connects the first bonding point and the second bonding point. The "second wire" indicates a wire which connects a portion above the ball portion of the first wire and a third bonding point. A plurality of wires corresponding to such a second wire may be provided in a semiconductor device.

The first wire includes, as described above, the ball portion 14a which is ball-bonded onto an electrode of the semiconductor element. The first wire further includes a folded portion 14b where the wire is extended and then folded back onto itself to protrude from over the ball portion 14a in the reverse direction of the end point of the wire (that is the second bonding point), and a flat portion 14c formed on the ball portion 14a in such manner where the wire extending from the folded portion 14b toward above the ball portion 14a is pressed onto the ball portion 14a. The diameter of the ball portion 14a is appropriately adjusted according to the size of the semiconductor device and the electrodes mounted on the semiconductor device, and for example, is about 50 µm to about 100 µm. Further, it is preferable that the folded portion 14b does not excessively protrude from the peripheral portion on the ball portion 14a. For example, in a case where the diameter of the ball portion 14a is in a range described above, the distance from the center of the ball portion 14a to the tip of the folded portion 14b is preferably about 10 µm to about 100 µm. The flat portion 14c is arranged over the center of the ball portion.

Figure 5A:
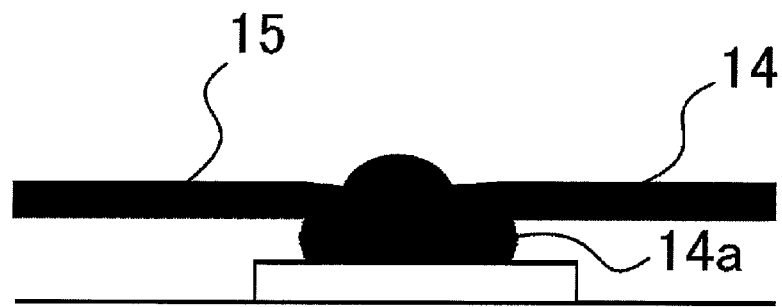
FIG. 5A is a schematic cross-sectional view illustrating wire bonding of a semiconductor device according to a comparative example.
Figure 5B:
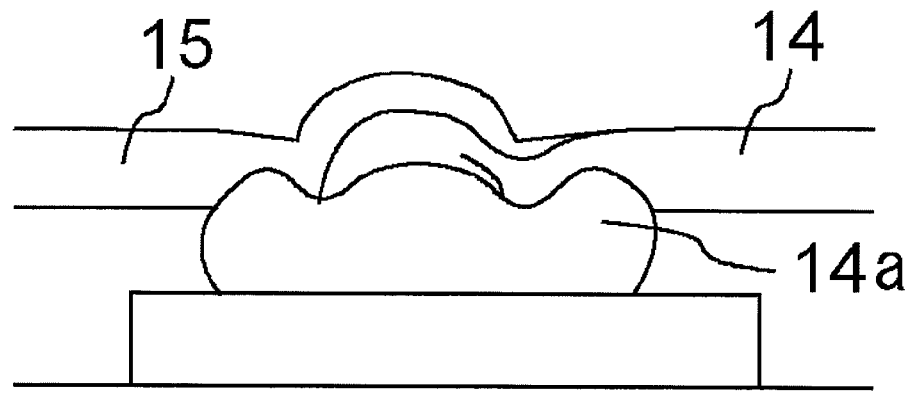
FIG. 5B is an enlarged view of FIG. 5A.

It is preferable that the first wire 14 extends from the flat portion 14c toward end point of the wire 14, in approximately horizontal direction. The term "approximately horizontal" as used herein refers to a direction approximately in parallel with the surface of the ball portion 14b to which the wire (the lower wire 14) is ball-bonded. Also, the difference in height between the highest and lowest points on the upper surface of the ball portion, that is the contacting surface where the first wire 14 (the first wire 14 at the lower side) and the ball portion 14a are bonded, is preferably a half or less of the diameter of the wire. That is, the linear wire extending from the ball portion is preferably bonded to the ball portion as shown in FIG. 5B, without excessive bending or deformation. Also, it is preferable that a space 18 is defined between the folded portion 14b of the wire and the ball portion 14a and between the second wire extending from the flat portion 14c and the ball portion 14a. With this arrangement, sufficient connection can be ensured and good thermal dissipation can be obtained. A part of a side surface defining a space 18 includes a curved surface formed by folding the first wire back onto itself (by forming a folded portion 14b of the wire).

The end portion of the second wire 15 (portion to be bonded on the first wire) is arranged approximately horizontal to the flat portion 14c of the first wire 14. The second wire 15 is bonded onto the first wire 14 over the center of the ball portion 14a of the first wire, and it is preferable that a space is defined between the second wire 15 and the ball portion 14a of the first wire at a location over a peripheral portion on the ball portion 14a of the first wire. With this arrangement, sufficient connection can be ensured and good thermal dissipation can be obtained. A sealing resin may be provided in the space portion.

The wire preferably has characteristics of such as good ohmic contact and good mechanical connection with the electrodes of the semiconductor element, and good electric conductivity and thermal conductivity. The thermal conductivity is preferably about 0.01 cal/S·cm$^2$.° C./cm or higher, and more preferably about 0.5 cal/S·cm$^{2.°}$ C./cm or higher. In view of workability, the diameter of the wire is preferably about 10 µm to about 45 µm. Examples of the material for such wire include a metal such as gold, copper, platinum, and aluminum, and an alloy thereof. Among those, gold is preferable in view of bonding reliability, stress relaxation after bonding, or the like.

(Method of Manufacturing)

A method of manufacturing of the semiconductor device according to present embodiment includes a first step of ball bonding a first wire, and a second step of bonding a second wire onto a ball portion of the first wire.

Wire bonding method used in the wire connection in the present embodiment is not specifically limited, but generally, thermocompression wire bonding, ultrasonic thermocompression wire bonding, or the like, can be suitably employed.

Hereinafter, each step will be described in detail below.

(First Step)

A ball formed by melting a wire is bonded (press-bonded) onto an electrode of the semiconductor element which is a first bonding point. A different portion of the wire extending from the press-bonded ball is further press-bonded onto the press-bonded ball, and then the wire is pulled toward a second bonding point and is connected to the second bonding point.

In this first step, firstly, a wire is passes through a jig of a capillary and the tip of the wire is melted by applying high temperature such as a spark to form a ball. The temperature is not specifically limited and can be adjusted according to the material, diameter, or the like of the wire to use. For example, this temperature may be 360° C. or lower. The size of the ball is not specifically limited, and generally, a diameter of about 2 to 20 times, preferably about 2 to 10 times of the diameter of the wire can be employed.

Then, the ball is press-bonded on a metal member or a surface of the electrode. In the description of each step, in order to distinguish the ball formed at the tip of a wire prior to bonding, the ball bonded to a bonding point by press-bonding is referred to as a "press-bonded ball". In the present invention, as described above, this press-bonded point (joining point) is referred to as a first bonding point. The load in this case can be appropriately adjusted by, for example, according to the spread diameter of the ball on the metal member or the electrode surface. At this time, press-bonding may be carried out while applying ultrasound.

Next, in order to form a folded portion, the capillary is moved in the reverse direction to pull the first wire in the reverse direction from the connection end point (that is a second bonding point) of the first wire. In this case, the "opposite direction" includes a range of about 150° to about 210° with respect to the second bonding point. It is suitable to adjust the amount of the wire that is pulled out, that is, the moving distance of the capillary, to about 10 µm to about 100 µm. Also, a horizontal distance from the center of the first ball portion to the center of the capillary moved in the reverse direction from the second bonding point is referred to as a reverse amount of the capillary. In a case where the diameter of the ball portion of the first wire is about 50 µm to about 100 µm, the reverse amount of the capillary is preferably about 10 µm to about 100 µm. The shift amount and the reverse amount of the capillary determined the distance from the center of the ball portion to the folded end, that is, determine the length of the folded portion.

The capillary is then lifted to an appropriate height at the extended position and moved back to a position directly over the ball (press-bonded ball), then lowered so that the position directly above the press-bonded ball, the capillary is pressed against the first wire which has been bonded to the press-bonded ball and another part of the first wire which is extending from the press-bonded ball, that is, the extended portion of the wire, is press-bonded to the first wire which has been bonded to the press-bonded ball. As a result, the surface of the ball and the surface of the wire positioned in the vicinity of the ball can be made approximately flat. In this case, the press-bonding may be performed while applying ultrasonic waves, but the press-bonding is preferably performed without applying ultrasonic waves. This is because the wire may be crushed and made thin by the ultrasonic wave, which may cause a decrease in bonding reliability. Also, an upward extension (occupying space) of the wire can be reduced by press-binding a part of the first wire on another part of the first wire at a location directly above the press-bonding ball, so that, for example, the total height of a part of the first wire and another part of the first wire, which have been bonded together, from the bottom surface of the press-bonded can be limited to about 1.0 to about 5.0 times of the diameter of the wire, or in a different viewpoint, to up to about 1 to 5 times, more preferably to up to about 1 to 3 times of the height of the press-bonded ball.

Next, the wire is pulled from directly above the press-bonded ball toward the second bonding point and bonded to the second bonding point. In this case, the bonding can be carried out either applying or not applying ultrasonic waves.

(Second Step)

After the first step, a second wire is bonded onto the ball portion of the first wire. The second wire may be bonded such that, it is ball-bonded on a third bonding point which is at a different position from the first and second bonding points and then is pulled toward the first bonding point and bonded to the third bonding point.

In this second step, firstly in the same manner as in the first step, a wire is passes through a jig of a capillary and the tip of the wire is melted by applying high temperature such as a spark to form a ball. The temperature is not specifically limited and can be adjusted according to the material, diameter, or the like of the wire to use. For example, this temperature may be about 360° C. or lower. The size of the ball is not specifically limited, and generally, a diameter of about 2 to about 20 times, preferably about 2 to about 10 times, further preferably about 2 to 5 times of that of the diameter of the wire can be employed.

Then, the ball is press-bonded on a metal member or a surface of the electrode. In the present invention, as described above, this press-bonded point (joining point) is referred to as a first bonding point. The load in this case can be appropriately adjusted by, for example, according to the spread diameter of the ball on the metal member or the electrode surface. At this time, press-bonding may be carried out while applying ultrasound. Also, in the same manner as in the first step, a flat portion may be formed on the surface of the ball portion of the second wire by press-bonding the ball formed by melting the wire, and a different portion of the wire extending from the press-bonded ball is further press-bonded on the press-bonded ball.

Next, the capillary is moved from over the third bonding point to over the ball portion of the first wire. This time, the capillary is preferably moved to a position which is off-set from directly over the center of the ball portion of the first wire in the opposite direction to the ball portion of the second wire. In this case, the "opposite direction" includes a range of about 150° to about 210° relative to the direction from the center of the ball portion of the first wire to the second bonding point. Herein, in the state of the capillary being positioned over the ball portion of the first wire, the distance in the horizontal direction from the center of the ball portion of the first wire to the center of the capillary may be referred to as the "shift amount of the capillary". In a case where the diameter of the ball portion of the first wire is about 50 µm to about 100 µm, the shift amount of the capillary is preferably about 40 µm to about 80 µm. The shift amount and the reverse amount of the capillary determine the distance from the center of the ball portion to the folded end, that is, the length of the folded portion. Next, the capillary is lowered so as to be pressed against a position directly above the ball portion of the first wire and the second wire is bonded to the first wire.

When the capillary is pressed on the ball portion of the first wire with the center of the capillary being off-set with respect to the center of the ball portion of the first wire as just described, the face of the capillary can be pushed against the center of the ball portion of the first wire, so that excessive load can be prevented from being applied to a peripheral portion on the ball portion. With this arrangement, the second wire is bonded to cover the center of the ball portion of the first wire. The bonding load is preferably 40 to 80 gf. With this, good bonding state can be maintained.

If the bonding of the second wire is carried out with the center of the capillary positioning over the center of the ball portion of the first wire, that is, with the shift amount of the capillary being 0 (zero), the center of the ball portion cannot be pressed by the capillary because the center of the capillary is the portion from where the wire material is supplied. Accordingly, the pressure from the capillary is applied to the peripheral portion on the ball portion. This results in, for example, as shown in FIG. 5A and FIG. 5B, a state where the wire is pressed against the peripheral portion on the ball portion. As a result, the first wire extending from the ball portion is also pressed, which may cause degradation of the wire.

In the semiconductor device according to the present invention, a sequence of operations from forming a ball to bonding to a second bonding point described above are performed two or more times between any two different points. The operations are preferably performed three times, four times or more times according to the number of the semiconductor elements that are mounted, the type of electrodes of the semiconductor elements, and the type of the connection of the semiconductor elements. In a different point of view, the first bonding point and/or the second bonding point is preferably provided three or more in total per semiconductor element, and more preferably, two or more of each are provided.

[Second Embodiment]

Figure 4A:
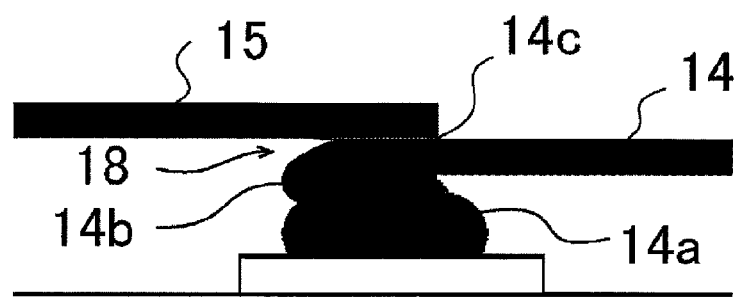
FIG. 4A is a schematic cross-sectional view illustrating wire bonding of a semiconductor device according to a second embodiment of the present invention.
Figure 4B:
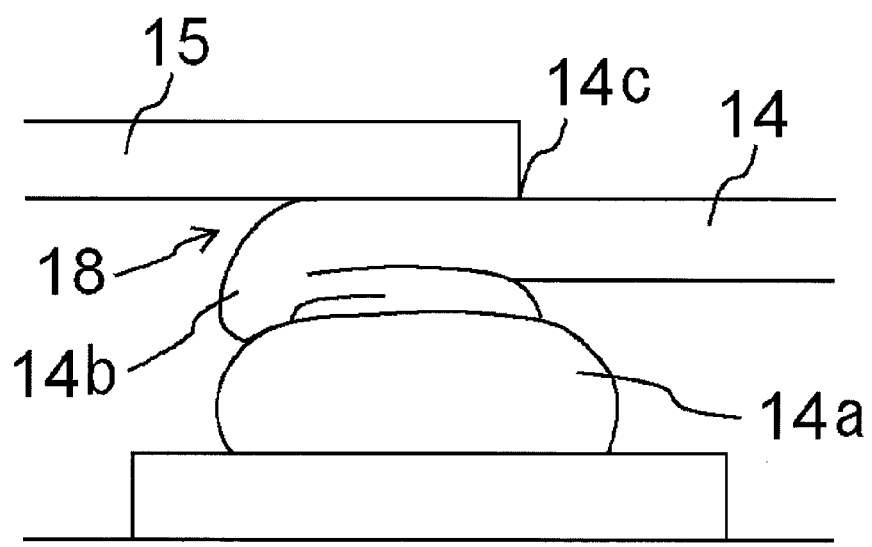
FIG. 4B is an enlarged view of FIG. 4A.

FIG. 4A and FIG. 4B are schematic cross-sectional views illustrating wire bonding of a semiconductor device according to a second embodiment of the present invention. The semiconductor device according to the second embodiment has different structures in the first wire 14 and the second wire 15 compared with the semiconductor device according to the first embodiment. That is, in the second embodiment, the folded portion 14*b* of the first wire is in contact with the ball portion 14*a*. Like members as in the first embodiment are designated by like numerals and their repeated description may be omitted.

A semiconductor device according to the present embodiment is constituted by at least a semiconductor element and a wire. A wire includes at least a first wire 14 and a second wire 15. In a semiconductor element, a first wire 14 is ball-bonded on an electrode and a second wire 15 is further bonded on the ball-bonded first wire 14. The second wire 15 is bonded to the first wire 14 over the center of the ball portion 14*a* of the first wire 14. Also, the first wire 14 or the second wire 15 is provided approximately horizontally over the ball portion 14*a* of the first wire 14. With this arrangement, stress imposed on the wire can be reduced, so that disconnection or the like of the wire can be prevented.

In the present embodiment, the second wire defines a space 18 between itself and the folded portion 14*b* of the first wire. Specifically, with regard to the first wire and the second wire, a space 18 is preferably defined between the folded portion 14*b* of the first wire and the second wire 15 at a location over the peripheral portion on the ball portion 14*a* of the first wire. With this arrangement, sufficient bonding can be maintained and heat generated by the semiconductor element and in the vicinity of the semiconductor element can be dissipated efficiently.

The wire connection of the present embodiment can be realized by adjusting, for example, the load applied during bonding of the second wire on the first wire, the reverse amount and/or the shift amount of the capillary relative to the ball portion of the first wire, and so on. Specifically, reducing the reverse amount enable to reduce the length of the folded portion, so that the folded portion can be pressed against the ball portion.

Examples of a semiconductor device according to the present invention will be described in detail below with reference to Figures.

EXAMPLE 1

FIG. 1 is a schematic plan view showing a semiconductor device according to a first example of the present invention. FIG. 2 is a schematic cross-sectional view illustrating a step of wire bonding of a semiconductor device according to a first embodiment of the present invention. FIG. 3A and FIG. 3B are schematic cross-sectional views illustrating wire bonding of a semiconductor device according to a first example of the present invention. As shown in FIG. 1, the semiconductor device 10 of the present example is constituted with a semiconductor element (light emitting element) 11, a planar metal member 12, wires electrically connecting between the semiconductor element 11 and the metal member 12 and between the semiconductor elements 11 respectively, and a sealing resin 19 enclosing all the members integrally. The semiconductor device 10 has a reflecting member made of a member capable of reflecting light from the semiconductor element, and a light transmissive member filled in a recess which is defined in the reflecting member and has the semiconductor element mounted in the recess. In the semiconductor device 10, within the sealing resin 19, a protective element 13 is further mounted and electrically connected to the metal member 12. The wire includes a first wire 14 to be ball-bonded onto an electrode 16 of a semiconductor element 11 and a second wire 15 to be further bonded onto the ball-bonded first wire. The first wire 14 and the ball portion 14*a* of the first wire 14, and an end of the second wire 15 and the ball portion 14*a* of the first wire 14 define a space 18 respectively. A wire of 25 µm in diameter is used for the first wire and second wire.

The metal member 12 is a planar body made of an aluminum alloy and has a region to which a semiconductor element 11 is mounted, and a region extending in a single direction from the mounting region of the semiconductor element. The molded body of the sealing resin 19 is formed in a single body by holding a part of the metal member 12, in an approximately a rectangular parallelepiped shape (length of 3 mm, width of 3 mm, and height of 0.85 mm). The molded body defines an approximately circular (3 mm in diameter) window portion 19a near the center of the molded body. In the window portion 19a, a part of the metal member 12 is exposed and a semiconductor element 11 is mounted on the exposed metal member 12. Further, a light transmissive resin (not shown) is embedded (filled) in the window portion 19a.

The semiconductor element 11 has two electrodes formed on a surface of the semiconductor element, and each electrode is electrically connected to the metal member 12 or the other electrode, respectively, by a wire. The wires are directly bonded to a metal member surface or an electrode surface by way of wire bonding.

The first wire 14 is bonded such that, as shown in FIG. 2, on the first bonding point A1 of the electrode 16 of the semiconductor element 11, a ball formed by melting the wire is press-bonded on the surface of the electrode, and a part of the wire extending from the press-bonded ball is further press-bonded on the first wire over the pressed ball (ball portion), then, the wire is extended toward the second bonding point B2 of the metal member 12 and bonded on the surface of the metal member 12 (wedge-bonded portion). That is, a loop-shaped folded portion of wire is formed on the first bonding point A1 at the opposite side of the second bonding point B2, the surface and/or top portion of the press-bonded ball is squashed together with a part of the wire and has a relatively flat shape.

The bonding of the first wire 14 is carried out such that, firstly, the wire is passes through a capillary (not shown) and the tip of the wire is melted by applying high temperature of a spark to form a ball. Then, the ball is pressed against the electrode surface and bonded. This press-bonded point is referred to as first bonding point A1. The diameter of the ball is set to 70 μm. Next, as indicated by the dotted arrow in FIG. 2, the capillary is lifted from the press-bonded point and moved horizontally about 50 μm in the opposite direction so as to pull the wire out and extend it in the opposite direction to the second bonding point B2.

Thereafter, the capillary is lifted and moved directly above the ball and the wire is pulled out, then, the capillary is pressed against the ball. Thus, a different part of the wire extending from the press-bonded ball is further press-bonded on the press-bonded ball, so that the wire on the surface of the ball and in the vicinity of the ball surface becomes approximately flat. Next, as indicated by the solid arrow in FIG. 2, the capillary is lifted to pull out the wire and is moved horizontally in the opposite direction to the second bonding point B2, then, the capillary is lifted again to pull out the wire and moved horizontally, passing directly above the press-bonded ball to the second bonding point B2, then the capillary is lowered while pulling out the wire and bonds the wire to the second bonding point B2. With this, the first wire 14 which bridges between the first bonding point A1 and the second bonding point B2 is formed.

In this semiconductor device, a second wire 15 is provided on the first bonding point A1 of the electrode 16 to connect the electrode 16 and a different electrode 17 (third bonding point C1). If the series of steps described above is applied in the bonding of the second wire 15, the surface of the ball portion of the second wire 15 can be formed in a flat shape in the same manner as in the ball portion of the first wire 14. Also, the end point of the second wire 15 is over the electrode 16 on the semiconductor element 11, but a press-bonded ball has been already formed on the second electrode as the ball portion of the first wire. Because the press-bonded ball has a flat shape, it can serve as a protector for the electrode such as a pad electrode, thus enables bonding of the second wire 15.

In the present example, the bonding of the second wire 15 onto the ball portion of the first wire 14 is carried out with the shift amount of the capillary is 80 μm and the bonding load is 40 gf.

In the semiconductor device 10 thus constructed, the first wire 14 or the second wire 15 is provided approximately horizontally over the ball portion 14a of the first wire 14. In the present embodiment, the folded portion of the first wire 14 or the second wire 15 defines a space 18 between itself and the ball portion at a peripheral portion on the ball portion of the first wire 15. According to the semiconductor device 10 of the present example, good bonding state of the wires can be achieved and heat generated in the vicinity of the ball portions of the wires can be dissipated efficiently. In the same manner as in Example 1, 25 units of the semiconductor devices are prepared and a heat cycle test was carried out at −40° C. for a minute and at 100° C. for a minute for 3000 cycles.

After the test, it was confirmed that any breaking of the wire did not occur in the semiconductor devices of the Example 1.

Comparative Example

FIG. 5A and FIG. 5B are partially enlarged schematic cross sectional views of a semiconductor device according to a comparative example. The bonding of the second wire 15 onto the first wire 14 is carried out with the center of the capillary positioned above the center of the ball portion 14a of the first wire 14, that is, at the shift of the capillary of 0. As a result, above the ball portion 14a of the first wire 14, the first wire 14 and the second wire 15 are oriented not in parallel with each other and are pressed against the peripheral portion on the ball portion by firmly pushing the periphery of the center portion of the ball portion with the end surface of the capillary. In reliability test, the semiconductor devices of the comparative example exhibit more tendencies towards breaking of a wire, compared to the semiconductor devices of Example 1.

EXAMPLE 2

In the present example, a substantially similar semiconductor device is fabricated in substantially the same manner as in Example 1, except that the shift amount of the capillary is changed to 60 μm at the time of bonding the second wire onto the first wire. The semiconductor device of the present example is constituted with a semiconductor element, a planar metal member, wires respectively electrically connecting between the semiconductor element and the metal member and between the semiconductor elements, and a sealing resin enclosing all the members integrally. In the semiconductor device, within the sealing resin, a protective element is further mounted and electrically connected to the metal member. The wire includes a first wire to be ball-bonded on an electrode of a semiconductor element and a second wire to be further bonded onto the ball-bonded first wire. In the semiconductor device, the first wire or the second wire is preferably provided approximately horizontally over the ball portion of the first wire. Further, the folded portion of the first wire and the ball portion, or the second wire and the ball portion define a space at a location over a peripheral portion on the ball portion of the first wire. Also, with the semiconductor device of the present example, good bonding state of the wires can be achieved and heat generated in the vicinity of the ball portions of the wires can be dissipated efficiently.

EXAMPLE 3

In the present example, a substantially similar semiconductor device is fabricated in substantially the same manner as in Example 1, except that the shift amount of the capillary is changed to 40 µm at the time of bonding the second wire onto the first wire. The semiconductor device of the present example is constituted with a semiconductor element, a planar metal member, wires respectively electrically connecting between the semiconductor element and the metal member and between the semiconductor elements, and a sealing resin enclosing all the members in a single body. In the semiconductor device, within the sealing resin, a protective element is further mounted and electrically connected to the metal member. The wire includes a first wire to be ball-bonded on an electrode of a semiconductor element and a second wire to be further bonded on the ball-bonded first wire. In the semiconductor device, the first wire or the second wire is preferably provided approximately horizontally over the ball portion of the first wire. Also, the folded portion of the first wire or the second wire defines a space between itself and the ball portion at a peripheral portion on the ball portion of the first wire. According to the semiconductor device of the present example, good bonding state of the wires can be achieved and heat generated in the vicinity of the ball portions of the wires can be dissipated efficiently.

INDUSTRIAL APPLICABILITY

The semiconductor device of the present invention can be used not only in lighting devices used in image readers such as facsimile machines, copy machines, and image scanners, but also in various other lighting devices such as illumination light sources, backlight sources for LED displays, portable telephones, and so on, signaling devices, lighting switches, automotive brake lamps, various kinds of sensors, various kinds of indicators, and so on. The present invention can be utilized widely not only in semiconductor devices but also for wire bonding in various semiconductor devices such as IC and memory cells.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a semiconductor device comprising:
    forming a ball portion, by passing a first wire through a jig of a capillary, to ball bond the first wire at a first bonding point on an electrode provided on a semiconductor layer of a semiconductor element;
    forming a folded portion of the first wire by moving the capillary away from the first bonding point and then returning the capillary directly above the first bonding point and pressing the first wire on the ball portion;
    bonding a second wire on the ball portion of the first wire by passing the second wire through a jig of the capillary and moving the capillary to a position which is off-set from directly over the center of the ball portion at the first bonding point,
    wherein, the second wire is bonded to form a space between the folded portion of the first wire and the second wire.
2. A method according to claim 1, wherein the pressing the first wire further comprises:
forming a space between the ball portion of the first wire and the folded portion of the first wire.
3. A method according to claim 1, wherein the semiconductor element is a light emitting element.
4. A method according to claim 1, wherein the semiconductor element is located on a member of the semiconductor device.
5. A method according to claim 1, wherein the semiconductor element is located in a recess of a reflecting member of the semiconductor device.
6. A method according to claim 5, wherein the recess of the reflecting member is filled with a sealing resin.
7. A method according to claim 1, wherein the upper surface of the folded potion of the first wire is flat.
8. A method according to claim 1, wherein a part of the side surface of the space includes a curved surface.
9. A method according to claim 1, wherein the bonding is carried out while applying ultrasound.
10. A method according to claim 1, wherein the diameter of the ball portion is 2 to 20 times the diameter of the first wire.
11. A method according to claim 1, wherein said bonding further comprises:
    pressing the second wire on a flat upper surface of the folded portion of the first wire such that the second wire is bonded to the first wire over the center of the ball portion.
12. A method of manufacturing a semiconductor device comprising:
    ball bonding a first wire at a first bonding point on an electrode provided on a semiconductor layer of a semiconductor element b through a jig of a capillary;
    forming a folded portion of the first wire by moving the capillary away from the first bonding point and then returning the capillary directly above the first bonding point and pressing the first wire on the ball portion in order to form a space between the ball portion of the first wire and the folded portion of the first wire; and
    bonding a second wire on the ball portion of the first wire by passing the second wire through a jig of a capillary and moving the capillary to a position which is off-set from directly over the center of the ball portion at the first bonding point such that the second wire is bonded to cover the center of the ball portion of the first wire.
13. A method according to claim 12, wherein the semiconductor element is a light emitting element.
14. A method according to claim 12, wherein the semiconductor element is located on a member of the semiconductor device.
15. A method according to claim 12, wherein the semiconductor element is located in a recess of a reflecting member of the semiconductor device.
16. A method according to claim 15, wherein the recess of the reflecting member is filled with a sealing resin.
17. A method according to claim 12, wherein the upper surface of the folded potion of the first wire is flat.
18. A method according to claim 12, wherein a part of the side surface of the space includes a curved surface.
19. A method according to claim 12, wherein the bonding is carried out while applying ultrasound.
20. A method according to claim 12, wherein the diameter of the ball portion is 2 to 20 times the diameter of the first wire.
21. A method of manufacturing a semiconductor device comprising:
    mounting a light emitting element, including a semiconductor layer, on a member;
    providing an electrode on the semiconductor layer;

ball bonding a first wire on the electrode such that the first wire has a ball portion bonded on the electrode and a folded portion extended from the ball portion and folded back onto itself, wherein a portion extending toward the folded portion and a portion extending from the folded portion are in contact with each other over the ball portion;

bonding a second wire to the first wire over the ball portion; and providing a light transmissive resin in a window exposing a portion of the member and covering a sealing resin holding the electrode, the first wire and the second wire;

wherein the folded portion of the first wire or the second wire and the ball portion define a space therebetween at a location over a peripheral portion on the ball portion.

22. A method of manufacturing a semiconductor device comprising:

mounting a light emitting element, including a semiconductor layer, on a member;

providing an electrode on the semiconductor layer;

ball bonding a first wire on the electrode such that the first wire has a ball portion bonded on the electrode and a folded portion extended from the ball portion and folded back onto itself, wherein a portion extending toward the folded portion and a portion extending from the folded portion are in contact with each other over the ball portion;

bonding a second wire on the first wire over the ball portion; and locating a light transmissive resin in a window exposing a portion of the member and covering a sealing resin holding the electrode, the first wire and the second wire;

wherein the folded portion of the first wire and the second wire define a space therebetween at a location over a peripheral portion on the ball portion.

* * * * *